(12) United States Patent
Or-Bach

(10) Patent No.: US 6,236,229 B1
(45) Date of Patent: May 22, 2001

(54) INTEGRATED CIRCUITS WHICH EMPLOY LOOK UP TABLES TO PROVIDE HIGHLY EFFICIENT LOGIC CELLS AND LOGIC FUNCTIONALITIES

(75) Inventor: Zvi Or-Bach, Sunnyvale, CA (US)

(73) Assignee: eASIC Corporation, San Jose, CA (US)

( * ) Notice: Subject to any disclaimer, the term of this patent is extended or adjusted under 35 U.S.C. 154(b) by 0 days.

(21) Appl. No.: 09/310,962

(22) Filed: May 13, 1999

(51) Int. Cl.$^7$ .................................................. H03K 7/38
(52) U.S. Cl. .................................. 326/39; 326/40; 326/41
(58) Field of Search ................................. 326/41, 39, 40, 326/37

(56) References Cited

U.S. PATENT DOCUMENTS

| | | | |
|---|---|---|---|
| 3,473,160 | 10/1969 | Wahlstrom | 340/172.5 |
| 4,197,555 | 4/1980 | Uehara et al. | 357/70 |
| 4,706,216 | 11/1987 | Carter | 365/94 |
| 4,827,325 | 5/1989 | Or-bach et al. . | |
| 4,866,508 | 9/1989 | Eichelberger et al. . | |
| 4,910,417 | 3/1990 | El Gamal et al. | 307/465 |
| 4,924,287 | 5/1990 | Orbach | 357/51 |
| 4,933,738 | 6/1990 | Orbach et al. | 357/51 |
| 4,949,257 | 8/1990 | Orbach . | |
| 4,960,729 | 10/1990 | Orbach et al. | 437/101 |
| 5,027,027 | 6/1991 | Orbach et al. . | |
| 5,036,178 | 7/1991 | Orbach . | |
| 5,049,969 | 9/1991 | Orbach et al. | 357/51 |
| 5,068,063 | 11/1991 | Tremper, III . | |
| 5,111,273 | 5/1992 | Orbach et al. | 357/51 |
| 5,128,601 | 7/1992 | Orbach et al. . | |
| 5,132,571 | 7/1992 | McCollum . | |
| 5,138,194 | 8/1992 | Yoeli . | |
| 5,191,241 | 3/1993 | McCollum . | |
| 5,260,597 | 11/1993 | Orbach et al. | 257/529 |
| 5,329,152 | 7/1994 | Janai et al. | 257/529 |
| 5,341,041 | 8/1994 | El Gamal | 307/446 |
| 5,367,392 | 11/1994 | Janai . | |
| 5,404,033 | 4/1995 | Wong et al. | 257/202 |
| 5,420,544 | 5/1995 | Ishibashi | 331/11 |
| 5,512,765 | 4/1996 | Gaverick . | |
| 5,526,278 | 6/1996 | Powell . | |
| 5,545,904 | 8/1996 | Orbach . | |
| 5,550,839 | 8/1996 | Buch et al. . | |
| 5,565,758 | 10/1996 | Yoeli et al. | 326/41 |
| 5,581,098 | 12/1996 | Chang | 257/211 |
| 5,619,062 | 4/1997 | Janai et al. | 257/529 |
| 5,679,967 | 10/1997 | Janai et al. | 257/209 |
| 5,684,412 | 11/1997 | Yoeli et al. | 26/39 |
| 5,684,812 | 11/1997 | Shih | 372/19 |
| 5,687,325 | 11/1997 | Chang . | |
| 5,751,165 | 5/1998 | Yoeli et al. | 326/47 |
| 5,757,207 | * 5/1998 | Lytle et al. | 326/39 |
| 5,781,031 | 7/1998 | Bertin et al. . | |
| 5,781,033 | 7/1998 | Galbraith et al. | 326/39 |
| 5,815,003 | * 9/1998 | Pedersen | 326/39 |
| 5,815,726 | * 9/1998 | Cliff | 395/800.01 |
| 5,818,728 | 10/1998 | Yoeli et al. | 364/491 |
| 5,825,202 | 10/1998 | Tavana et al. | 326/39 |
| 5,825,203 | 10/1998 | Kusunoki . | |
| 5,861,641 | 1/1999 | Yoeli et al. | 257/211 |
| 5,883,525 | 3/1999 | Tavana et al. . | |
| 5,898,318 | * 4/1999 | Pedersen | 326/39 |
| 5,903,490 | 5/1999 | Rotem et al. . | |
| 5,959,466 | 9/1999 | McGowan . | |
| 6,020,755 | 2/2000 | Andrews et al. . | |
| 6,054,872 | 4/2000 | Fudanuki et al. . | |
| 6,066,960 | 5/2000 | Pedersen . | |

FOREIGN PATENT DOCUMENTS

WO 98/43353    10/1998    (WO) .

* cited by examiner

Primary Examiner—David Nelms
Assistant Examiner—Thong Le
(74) Attorney, Agent, or Firm—Venable; Jeffrey W. Gluck

(57) ABSTRACT

A semiconductor device including a logic array having a multiplicity of identical logic cells, each identical logic cell comprising at least one look-up table, a metal connection layer overlying the multiplicity of identical logic cells for providing a permanent customized interconnect between various inputs and outputs thereof.

15 Claims, 5 Drawing Sheets

INTEGRATED CIRCUITS WHICH EMPLOY LOOK UP TABLES TO PROVIDE HIGHLY EFFICIENT LOGIC CELLS AND LOGIC FUNCTIONALITIES

FIELD OF THE INVENTION

The present invention relates to integrated circuit devices as well as to methods for personalizing and programming such devices and resulting integrated circuit devices.

BACKGROUND OF THE INVENTION

Various types of personalizable integrated circuits and programmable integrated circuits are known in the art. Personalizable integrated circuits include gate arrays, such as laser programmable gate arrays, commonly known as LPGA devices, which are described, inter alia in the following U.S. Pat. Nos. 4,924,287; 4,960,729; 4,933,738; 5,111,273; 5,260,597; 5,329,152; 5,565,758; 5,619,062; 5,679,967; 5,684,412; 5,751,165; 5,818,728. Devices of this type are personalized by etching or laser ablation of metal portions thereof.

There are also known field programmable gate arrays, commonly known as FPGA devices, programmable logic devices, commonly known as PLD devices as well as complex programmable logic devices, commonly known as CPLD devices. Devices of these type are programmable by application of electrical signals thereto.

Programmable logic devices are known in which programmable look up tables are employed to perform relatively elementary logic functions. Examples of such devices appear in U.S. Pat. Nos. 3,473,160 and 4,706,216. Multiplexers are also known to be used as programmable logic elements. Examples of such devices appear in U.S. Pat. Nos. 4,910,417, 5,341,041 and 5,781,033. U.S. Pat. Nos. 5,684, 412, 5,751,165 and 5,861,641 show the use of multiplexers to perform customizable logic functions.

Problems of clock skew in gate arrays are well known. U.S. Pat. No. 5,420,544 describes a technique for reducing clock skew in gate arrays which employs a plurality of phase adjusting devices for adjusting the phase at various locations in gate arrays. Various clock tree design structures have been proposed which produce relatively low clock skew.

PCT Published Patent Application WO 98/43353 describes a functional block architecture for a gate array.

U.S. Pat. No. 5,825,202 describes an integrated semiconductor device comprising a FPGA portion connected to a maskdefined application specific logic area.

SUMMARY OF THE INVENTION

The present invention seeks to provide an improved integrated circuit which employs look up tables to provide highly efficient logic cells and logic functionalities.

There is thus provided in accordance with a preferred embodiment of the present invention a logic cell for use in a logic array, the logic cell including:
  at least one look-up table including a plurality of LUT inputs and at least one output; and
  at least one logic gate having a plurality of logic inputs and an output coupled to one of the plurality of LUT inputs.

According to one embodiment of the invention, the logic gate is a 2-input logic gate. According to an alternative embodiment of the invention, the logic gate is a NAND gate.

Preferably, the at least one look-up table includes at least one pair of look-up tables.

In accordance with a preferred embodiment of the invention, the logic cell also includes a multiplexer receiving outputs from the at least one pair of look-up tables.

In accordance with another preferred embodiment of the invention, the at least one look-up table includes first and second pairs of look-up tables, the logic cell also including first and second multiplexers, each multiplexer receiving outputs from a pair of look-up tables.

Preferably, the logic cell also includes a third multiplexer receiving outputs from the first and second multiplexers.

Additionally in accordance with a preferred embodiment of the present invention, the logic cell also includes a flip-flop for receiving an output from the first multiplexer.

In accordance with an alternative embodiment of the present invention, the logic cell also includes a multiplexer connected to an output of at least one look-up table and an inverter selectably connectable to at least one of an output of the multiplexer and an output of the look-up table.

The look-up table is preferably a programmable look-up table.

In accordance with a preferred embodiment of the present invention, the logic cell also includes a metal interconnection layer overlying at least a portion of the cell for providing a custom interconnection between components thereof.

There is also provided in accordance with a preferred embodiment of the present invention a semiconductor device including a logic array including a multiplicity of identical logic cells, each identical logic cell including at least one look-up table, a metal connection layer overlying the multiplicity of identical logic cells for providing a permanent customized interconnect between various inputs and outputs thereof.

Preferably each device includes at least one multiplexer and the at least one look-up table provides an input to the at least one multiplexer.

Additionally, each device preferably also includes at least one logic gate connected to at least one input of the look-up table.

According to one embodiment of the invention, the logic gate is a 2-input logic gate. According to an alternative embodiment of the invention, the logic gate is a NAND gate connected to an input of the at least one look-up table.

Preferably, the at least one look-up table includes at least one pair of look-up tables.

In accordance with a preferred embodiment of the present invention, the at least one multiplexer receives outputs from the at least one pair of look-up tables. Preferably, the at least one one multiplexer is configured to perform a logic operation on the outputs from the at least one pair of look-up tables.

In accordance with an embodiment of the invention, the at least one look-up table includes first and second pairs of look-up tables and the at least one multiplexer includes first and second multiplexers, each multiplexer receiving outputs from a pair of look-up tables.

Preferably, the look-up table is programmable.

In accordance with a preferred embodiment of the present invention, the device includes at least one simple logic gate selectably connected to at least one logic cell output.

Preferably, the simple logic gate is a two-input logic gate. Alternatively it may be an inverter or a buffer.

The device preferably also includes a multiplexer connected to an output of at least one look-up table and an inverter selectably connectable to an output of the at least one multiplexer.

In accordance with a preferred embodiment of the present invention, the device also includes a metal interconnection layer overlying at least a portion of the cell for providing a custom interconnection between components thereof.

There is also provided in accordance with a preferred embodiment of the present invention a logic array including at least one logic cell, the logic cell including:

at least one look-up table including a plurality of LUT inputs and at least one output; and at least one logic gate having a plurality of logic inputs and an output coupled to one of the plurality of LUT inputs.

The at least one look-up table is preferably a programmable look-up table.

According to one embodiment of the invention, the logic array is a 2-input logic gate. According to an alternative embodiment of the invention, the logic gate is a NAND gate.

Preferably, the at least one look-up table includes at least one pair of look-up tables.

In accordance with a preferred embodiment of the invention, the logic array also includes a multiplexer receiving outputs from the at least one pair of look-up tables.

In accordance with another preferred embodiment of the invention, the at least one look-up table includes first and second pairs of look-up tables, the logic cell also including first and second multiplexers, each multiplexer receiving outputs from a pair of look-up tables.

Preferably, the logic array also includes a third multiplexer receiving outputs from the first and second multiplexers.

Additionally in. accordance with a preferred embodiment of the present invention, the logic array also includes a flip-flop for receiving an output from the first multiplexer.

In accordance with an alternative embodiment of the present invention, the logic array also includes a multiplexer connected to an output of at least one look-up table and an inverter selectably connectable to at least one of an output of the multiplexer and an output of the look-up table.

In accordance with a preferred embodiment of the present invention, the logic array also includes a metal interconnection layer overlying at least a portion of the cell for providing a custom interconnection between components thereof.

The logic array may be integrated into a larger device also formed on the same substrate.

There is additionally provided in accordance with a preferred embodiment of the present invention a semiconductor device including:

a logic array including a multiplicity of identical logic cells, each identical logic cell including at least one flip-flop; and a metal connection layer overlying the multiplicity of identical logic cells for interconnecting various inputs and outputs thereof in a customized manner.

The semiconductor device may also include a clock tree providing clock inputs to at least one of the at least one flip-flop of the multiplicity of identical logic cells.

Each logic cell in the semiconductor device may also receive a scan signal input which determines whether the cell operates in a normal operation mode or a test operation mode, wherein in a test operation mode nearly each flip-flop receives an input from an adjacent flip-flop thereby to define a scan chain.

The logic cell preferably includes a programmable look-up table.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

The present invention provides a customizable logic array device including a substrate having at least one gate layer and typically at least first, second and third metal layers formed thereon, wherein the gate layer includes a multiplicity of identical unit logic cells. It is appreciated that the customizable logic array device may be integrated into a larger device also formed on the same substrate.

The present invention also provides a customizable logic array device including an array of cells, the device having at least one transistor layer, including a multiplicity of transistors, formed on a substrate and at least one interconnection layer which connects the transistors to define the array of cells, each of the cells having a multiplicity of inputs and at least one output.

There are preferably provided additional interconnection layers, at least one of which is custom made to interconnect the inputs and outputs of the various cells to provide a custom logic function.

Preferably at least some of the cells are identical.

Figure 1:
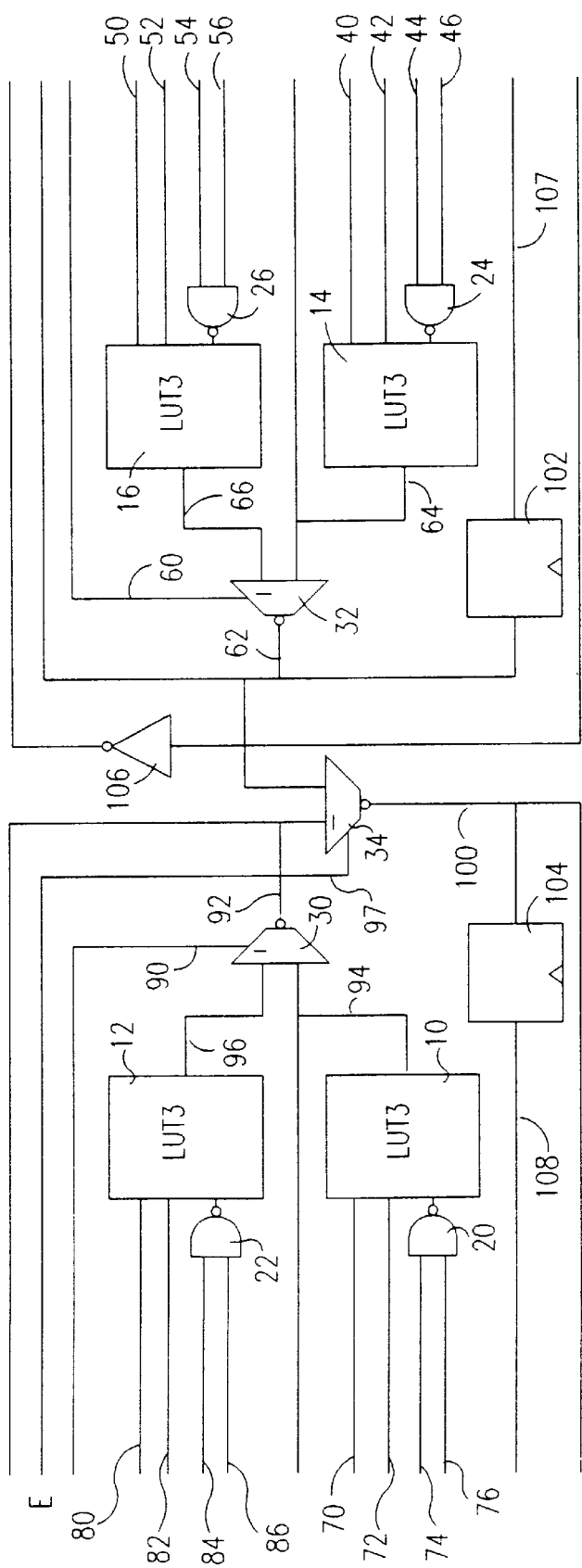
FIG. 1 is a simplified illustration of the gate layer of a logic cell constructed and operative in accordance with one preferred embodiment of the present invention.

Reference is now made to FIG. 1, which illustrates a cell preferably forming part of a gate layer of a logic array device constructed and operative in accordance with a preferred embodiment of the present invention. The logic device preferably comprises an array of cells, each cell comprising 3-input look-up tables (LUTs), respectively designated by reference numerals 10, 12, 14 and 16. Coupled to a first input of each look-up table, hereinafter referred to as a LUT input, is a 2-input NAND gate. The NAND gates are designated by respective reference numerals 20, 22, 24 and 26.

Alternatively, any other suitable type of logic gate, such as, for example, a NOR, AND, OR, XOR or 3-input logic gate may be employed instead of the NAND gates.

Outputs of LUTs 10 and 12 are supplied as inputs to a multiplexer 30, while outputs of LUTs 14 and 16 are supplied as inputs to a multiplexer 32. The outputs of multiplexers 30 and 32 are supplied to a multiplexer 34. Multiplexers 30, 32 and 34 are preferably inverting multiplexers, as shown.

A NAND fed four-input LUT may be realized by connecting respective inputs 40, 42, 44 and 46 of LUT 14 and NAND gate 24 to respective inputs 50, 52, 54 and 56 of LUT 16 and NAND gate 26. The inputs of the resulting NAND fed four-input LUT are inputs 40, 42, 44 & 46 and the select input to multiplexer 32, which is designated by reference numeral 60. The output of the NAND fed four-input LUT is the output of multiplexer 32, which is designated by reference numeral 62.

A NAND fed four-input LUT may be realized by connecting respective inputs 70, 72, 74 and 76 of LUT 10 and NAND gate 20 to respective inputs 80, 82, 84 and 86 of LUT 12 and NAND gate 22. The inputs of the resulting NAND fed four-input LUT are inputs 70, 72, 74 & 76 and the select input to multiplexer 30, which is designated by reference numeral 90. The output of the NAND fed four-input LUT is the output of multiplexer 30, which is designated by reference numeral 92.

It is further appreciated that if the output of LUT 14, designated by reference numeral 64, is connected to the select input 60, multiplexer 32 performs a NAND logic function on the output of LUT 14 and the output of LUT 16, designated by reference numeral 66.

Similarly, if the output of LUT 10, designated by reference numeral 94, is connected to the select input 90 of multiplexer 30, multiplexer 30 performs a NAND logic function on the output of LUT 10 and the output of LUT 12, designated by reference numeral 96.

It is appreciated that other logic functions may be generated by multiplexers 30 and 32. For example, if input 60 and output 66 are connected together, a NOR logic function is performed on outputs 64 and 66, having an output at output 62.

A NAND fed five-input LUT may be realized by connecting respective inputs 40, 42, 44, 46 and 60 of one NAND fed four-input LUT with inputs 70, 72, 74, 76 and 90 of the other NAND fed four-input LUT. The inputs of the resulting NAND fed five-input LUT are inputs 40, 42, 44, 46 and 60 as well as the E select input to multiplexer 34, designated by reference numeral 97. The output of the NAND fed five-input LUT is designated by reference numeral 100.

It is additionally appreciated that if the output 62 of multiplexer 32 is connected to input 97, multiplexer 34 performs a NAND logic function on the output 92 of multiplexer 30 and the output 62 of multiplexer 32.

It is further appreciated that if the output 92 of multiplexer 30 is connected to input 97, multiplexer 34 performs a NOR logic function on the output 92 of multiplexer 30 and the output 62 of multiplexer 32.

Preferably a flip flop 102 is coupled to the output 62 of multiplexer 32 and a flip flop 104 is coupled to the output 100 of multiplexer 34.

Additionally an inverter 106 is provided for selectable interconnection to one of the cell outputs 62, 64, 92, 94, 107, 108 and 100. Inverter 106 could be used to change the polarity of a logic signal to provide a desired logic function. Inverter 106 could also be used to buffer certain signals to effectively drive a relatively heavy load, such as in cases where a single output is supplied to multiple inputs or along a relatively long interconnection path. It is appreciated that alternatively or additionally any other one or more suitable logic gate, such as for example, a NAND, NOR, XOR or XNOR gate, may be provided in the cell.

It is appreciated that various interconnections between inputs and outputs of various components of the cell described hereinabove and between inputs and outputs of various cells of the logic array are preferably achieved by one or more selectably configurable overlying metal layers, which are preferably mask configurable. A permanent customized interconnect is thus provided.

Figure 2:
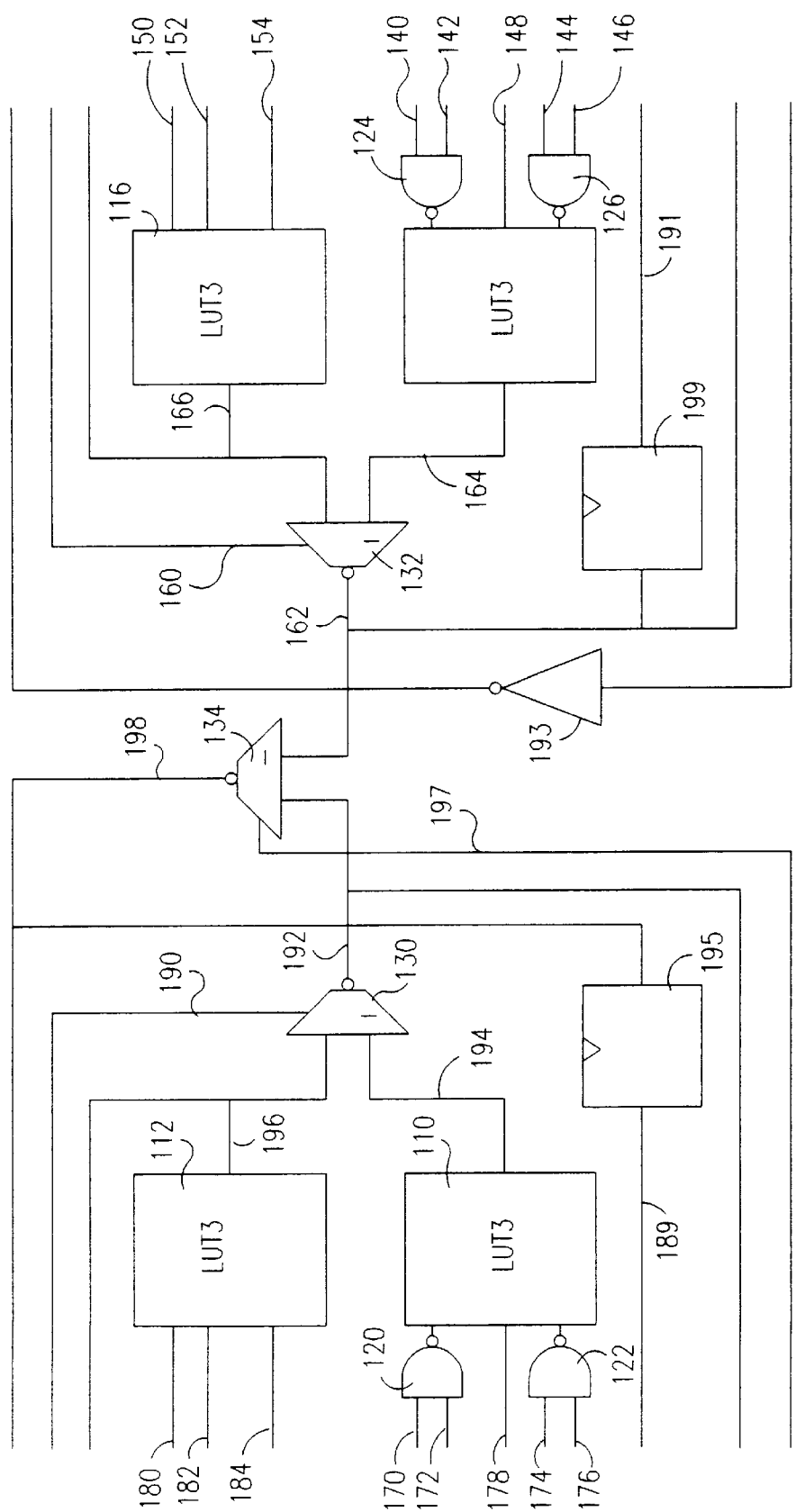
FIG. 2 is a simplified illustration of the gate layer of a logic cell constructed and operative in accordance with another preferred embodiment of the present invention.

Reference is now made to FIG. 2, which illustrates a cell preferably forming part of a gate layer of a logic array device constructed and operative in accordance with another preferred embodiment of the present invention. The cell of FIG. 2 is presently believed by the inventor to be superior in certain respects to the cell of FIG. 1. The logic device preferably comprises an array of cells, each cell comprising 3-input look-up tables (LUTs), respectively designated by reference numerals 110, 112, 114 and 116. Coupled to first and second inputs of each of look-up tables 110 and 114, hereinafter referred to as a LUT inputs, is a 2-input NAND gate. The NAND gates are designated by respective reference numerals 120, 122, 124 and 126.

Alternatively, any other suitable type of logic gate, such as, for example, a NOR, AND, OR, XOR or 3-input logic gate may be employed instead of the NAND gates.

Outputs of LUTs 110 and 112 are supplied as inputs to a multiplexer 130, while outputs of LUTs 114 and 116 are supplied as inputs to a multiplexer 132. The outputs of multiplexers 130 and 132 are supplied to a multiplexer 134. Multiplexers 130, 132 and 134 are preferably inverting multiplexers, as shown.

A four-input LUT may be realized by connecting respective inputs 140, 142, and 144 and 146 of the NAND gates 124 and 126, and then connecting inputs 140, 144, and 148 of LUT 114 to respective inputs 150, 152 and 154 of LUT 116. The inputs of the resulting four-input LUT are inputs 140, 144 & 148 and the select input to multiplexer 132, which is designated by reference numeral 160. The output of the four-input LUT is the output of multiplexer 132, which is designated by reference numeral 162.

A four-input LUT may be realized by connecting the inputs 170, 172, and 174, 176 of NAND gates 120 and 122, and then connecting inputs 170, 174 and 178 of LUT 110 to respective inputs 180, 182 and 184 of LUT 112. The inputs of the resulting four-input LUT are inputs 170, 174 & 178 and the input to multiplexer 130, which is designated by reference numeral 190. The output of the four-input LUT is the output of multiplexer 130, which is designated by reference numeral 192.

It is further appreciated that if the output of LUT 116, designated by reference numeral 166, is connected to the select input 160, multiplexer 132 performs a NAND logic function on the output of LUT 114 and the output of LUT 116.

Similarly, if the output of LUT 112, designated by reference numeral 196, is connected to the select input 190 of multiplexer 130, multiplexer 130 performs a NAND logic function on the output of LUT 110 and the output of LUT 112, appreciated that other logic functions may be generated by multiplexers 130 and 132. For example, if input 160 and output 164 are connected together, a NOR logic function is performed on outputs 164 and 166, having an output at output 162.

It is additionally appreciated that if the output 162 of multiplexer 132 is connected to input 197, multiplexer 134 performs a NOR logic function on the output 192 of multiplexer 130 and the output 162 of multiplexer 132.

It is further appreciated that if the output 192 of multiplexer 130 is connected to input 197, multiplexer 134 performs a NAND logic function on the output 192 of multiplexer 130 and the output 162 of multiplexer 132.

Preferably a flip flop 199 is coupled to the output 162 of multiplexer 132 and a flip flop 195 is coupled to the output 198 of multiplexer 134.

Additionally an inverter 193 is provided for selectable interconnection to one of the cell outputs 162, 166, 192, 196, 191, 189 and 198. Inverter 193 could be used to change the polarity of a logic signal to provide a desired logic function.

Inverter 193 could also be used to buffer certain signals to effectively drive a relatively heavy load, such as in cases where a single output is supplied to multiple inputs or along a relatively long interconnection path. It is appreciated that alternatively or additionally any other one or more suitable logic gate, such as for example, a NAND, NOR, XOR or XNOR gate, may be provided in the cell.

It is appreciated that various interconnections between inputs and outputs of various components of the cell described hereinabove and between inputs and outputs of various cells of the logic array are preferably achieved by one or more selectably configurable overlying metal layers, which are preferably mask configurable. A permanent customized interconnect is thus provided.

Figure 3:
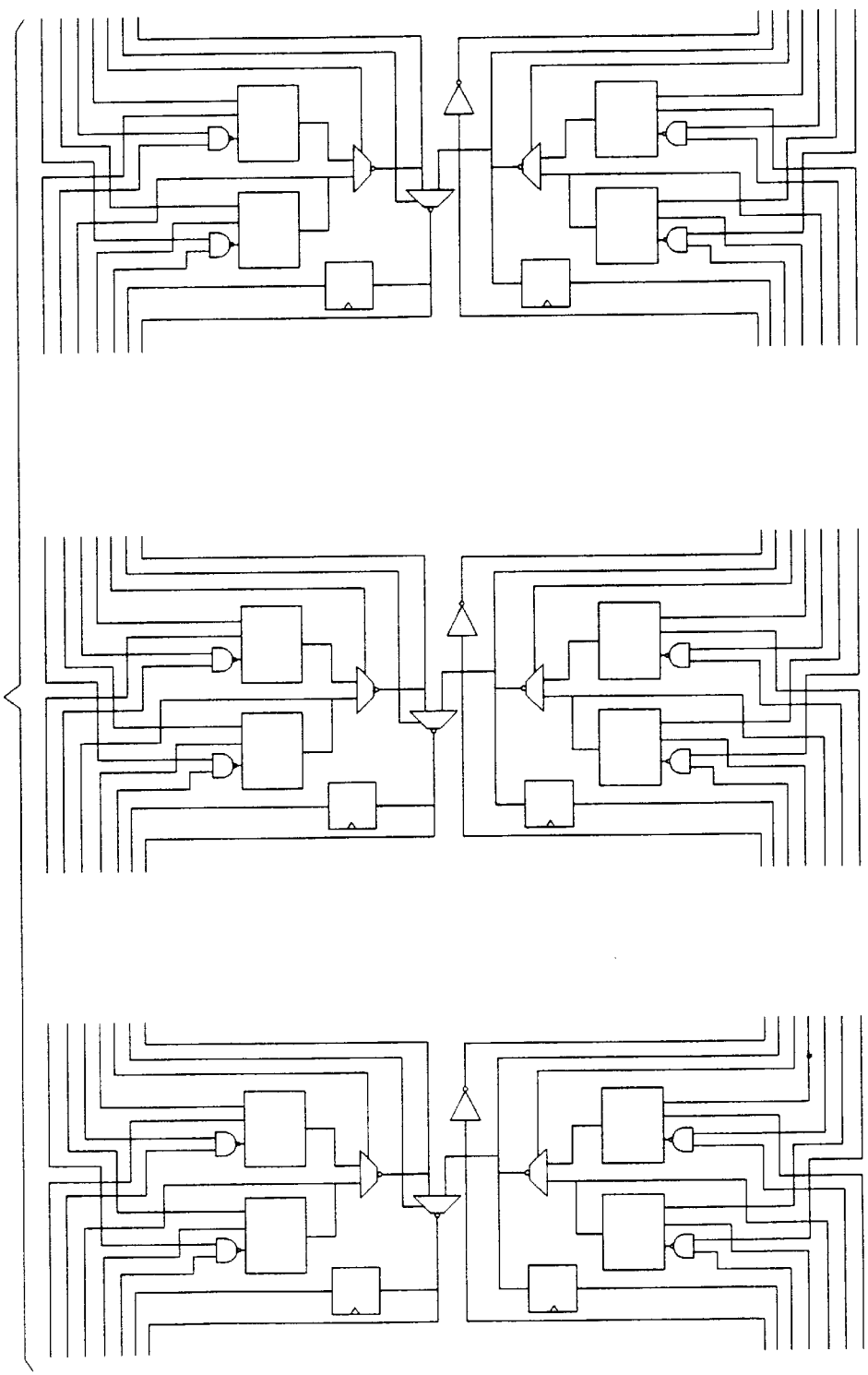
FIG. 3 is a simplified illustration of a gate layer of a plurality of logic cells which constitute a portion of a logic array in accordance with a preferred embodiment of the present invention.

Reference is now made to FIG. 3, which is an illustration of a plurality of the cells of FIG. 1, which constitute a portion of a logic array, preferably a customizable logic array in accordance with a preferred embodiment of the present invention. It is appreciated that alternatively, FIG. 3 could include a plurality of the cells of FIG. 2.

Figure 4:
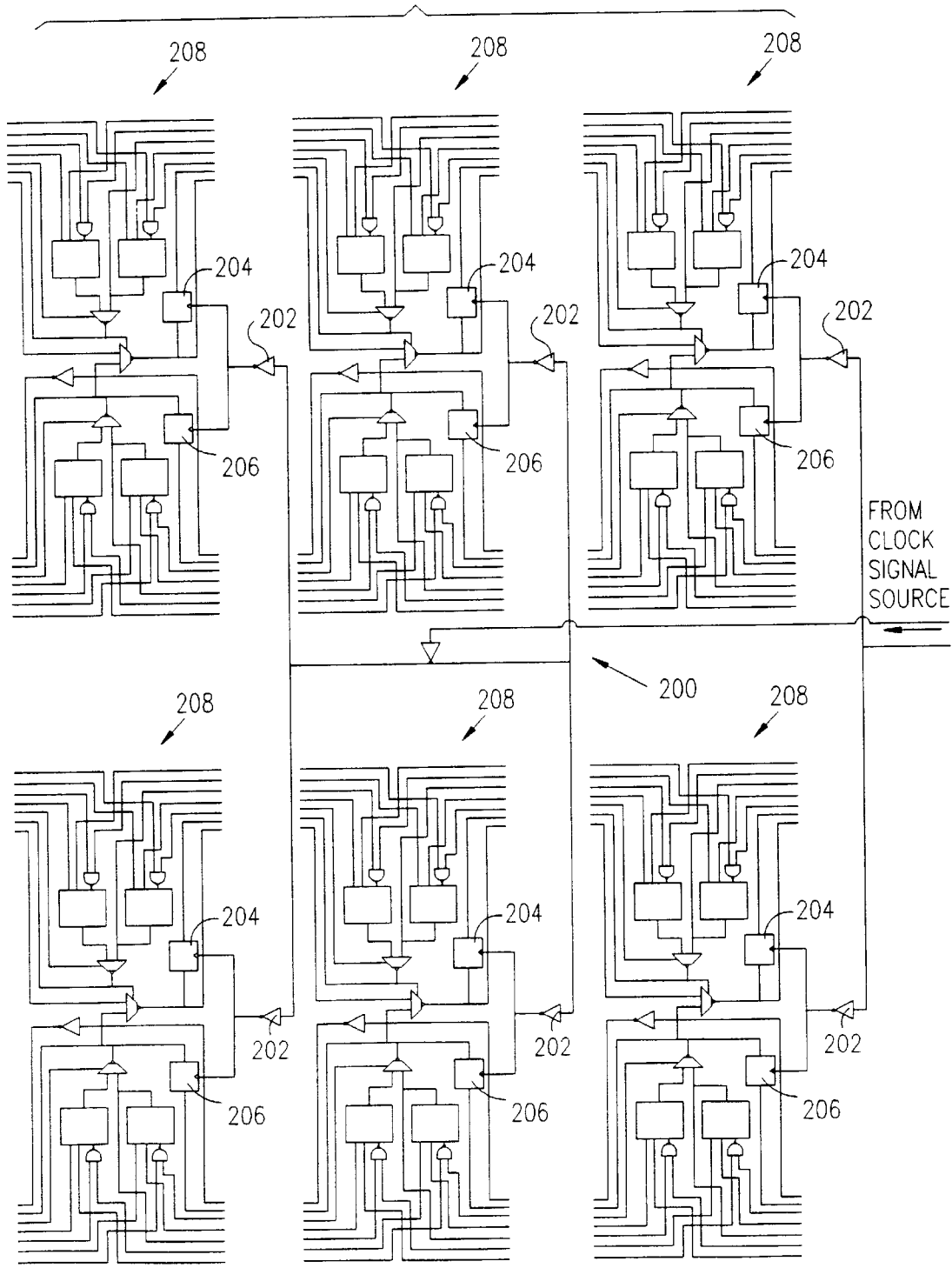
FIG. 4 is a simplified illustration of a gate layer of a plurality of logic cells which constitute a portion of a logic array and incorporate a clock tree in accordance with a preferred embodiment of the present invention.

Reference is now made to FIG. 4, which is a simplified illustration of a gate layer of a plurality of logic cells which constitute a portion of a logic array and incorporate a clock tree in accordance with a preferred embodiment of the present invention.

As seen in FIG. 4, a clock tree distribution circuit, generally indicated by reference numeral 200 provides clock signals from a clock signal source (not shown) via an inverter 202 to each pair of flip-flops 204 and 206 in each logic cell 208. Although the logic cell of FIG. 1 is shown, it is appreciated that alternatively and preferably, the logic cell of FIG. 2 may be employed. It is appreciated that the structure of FIG. 4 is very distinct from the prior art wherein a clock tree distribution circuit is implemented in at least one custom interconnection layer.

In accordance with a preferred embodiment of the present invention, three metal layers, such as metal 1, metal 2 and metal 3 are typically standard. Three additional metal layers, such as metal 4, metal 5 and metal 6 may be used for circuit personalization for a specific application. In logic arrays of this type, it is often desirable to provide a multiplicity of clock domains. Each such clock domain requires its own clock distribution tree. Connection of the clock domains can be readily achieved by suitable personalization of an upper metal layer, such as metal 6.

It is appreciated that the number of cells connected to a given distribution tree may vary greatly, from tens of cells to thousands of cells. This variation can be accommodated easily using the structure of the present invention.

It is appreciated that each flip flop in each cell has approximately the same interconnection load on the clock distribution tree.

Multiple phase lock loops (PLLs) may be employed to adjust the phase of each clock tree with respect to an external clock.

Figure 5:
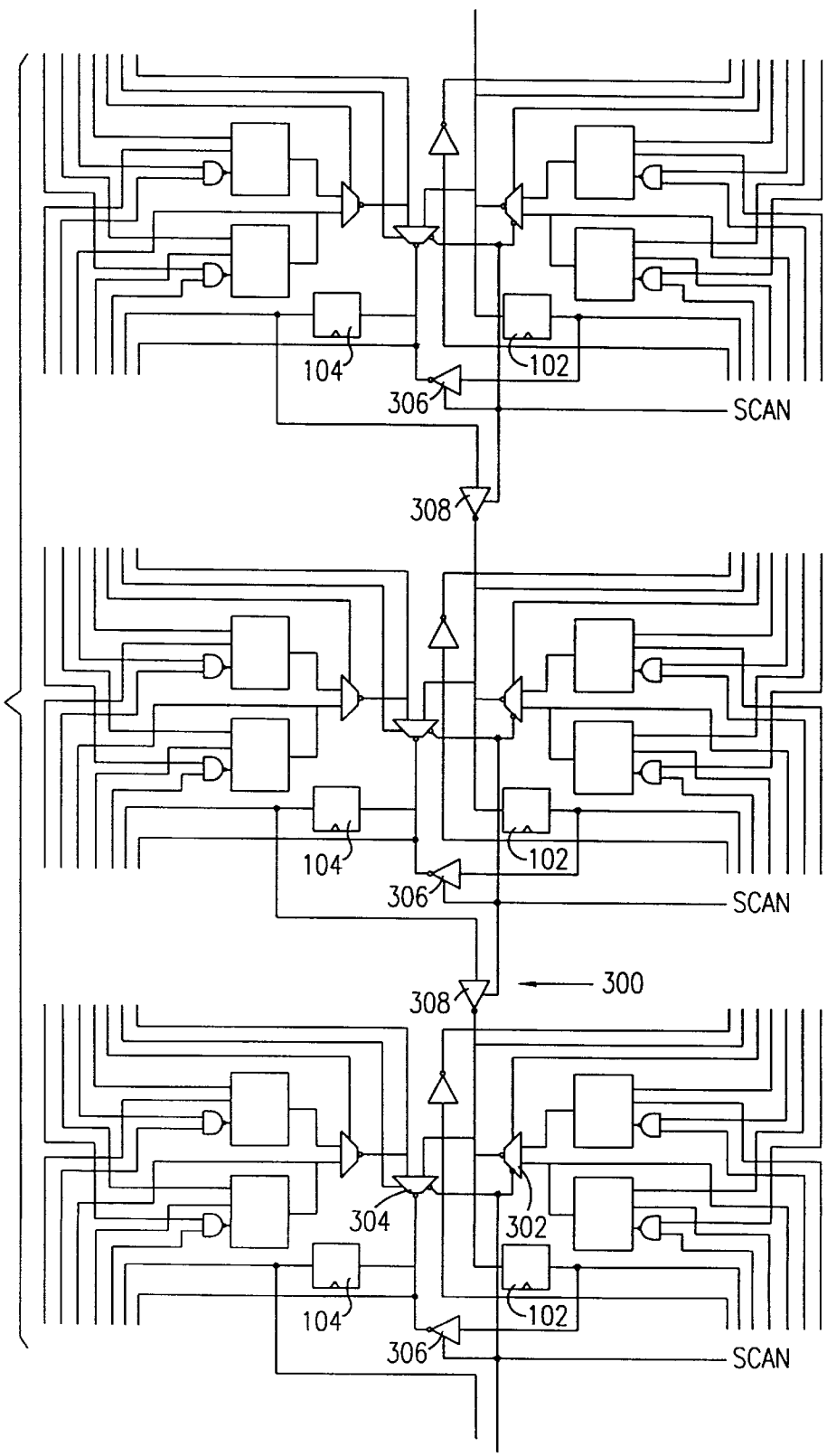
FIG. 5 is a simplified illustration of a gate layer of a plurality of logic cells which constitute a portion of a logic array and incorporate a scan chain in accordance with a preferred embodiment of the present invention.

Reference is now made to FIG. 5, which is a simplified illustration of a gate layer of a plurality of logic cells which constitute a portion of a logic array and incorporate a scan chain in accordance with a preferred embodiment of the present invention. Although the cells of FIG. 1 are shown in FIG. 5, it is appreciated that alternatively, the cells of FIG. 2 may be employed.

Whereas in the prior art scan chains, which provide test coverage for integrate circuits are known to involve not insignificant overhead in terms both of real estate and performance. Conventionally, scan chains are usually inserted either as part of a specific circuit design or during post processing.

In accordance with the present invention, as shown in FIG. 5, a scan chain 300 is implemented as part of the basic structure of a logic cell array. The invention thus obviates the need to insert scan chains either as part of a specific circuit design or during post processing. A multiplicity of scan chains can be integrated in a logic cell array in accordance with a preferred embodiment of the present invention.

Connection of the scan chains can be readily achieved by suitable personalization of an upper metal layer, such as metal 6.

In the embodiment of FIG. 5, multiplexers 32 and 34 are preferably replaced by corresponding 3-state multiplexers 302 and 304. A pair of 3-state inverters 306 and 308 are provided in each cell and are connected as shown. During normal operation of the array, the scan signal is a logic "low" or "0", thus enabling multiplexers 302 and 304 and disabling inverters 306 and 308.

During testing of the array, the scan signal is a logic "high" or "1" and the multiplexers 302 and 304 are disabled while the inverters 306 and 308 are enabled. In such a scan mode the output of flip flop 102 of a given cell is fed to the input of flip flop 104 of that cell and the output of flip flop 104 is fed to the input of flip flop 102 of the adjacent cell, thus creating a scan chain.

It is appreciated that additional multiplexers may also be employed in this embodiment.

It will be appreciated by persons skilled in the art that the present invention is not limited to what has been particularly shown and described hereinabove. Rather the scope of the invention includes both combinations and subcombinations of the various features described herein as well as modifications and variations thereof as would occur to a person of ordinary skill in the art upon reading the foregoing description and which are not in the prior art.

I claim:

1. A logic cell for use in a logic array, the logic cell having a multiplicity of inputs and at least one output and comprising:

at least one look-up table including a plurality of LUT inputs and at least one output; and at least one logic gate having a plurality of logic inputs, which are at least a part of said multiplicity of inputs, and an output coupled to one of the plurality of LUT inputs, and wherein said at least one logic gate is a NAND gate.

2. A logic cell for use in a logic array, the logic cell having a multiplicity of inputs and at least one output and comprising:

at least one look-up table including a plurality of LUT inputs and at least one output; and a NAND gate having a plurality of logic inputs, which are at least a part of said multiplicity of inputs, and an output coupled to one of the plurality of LUT inputs, and wherein said at least one look-up table comprises first and second pairs of look-up tables, said logic cell also comprising first and second multiplexers, each multiplexer receiving outputs from a pair of look-up tables.

3. The logic cell according to claim 2 and also comprising a third multiplexer receiving outputs from said first and second multiplexers.

4. The logic cell according to claim 3 and also comprising a flip-flop for receiving an output from said first multiplexer.

5. A logic cell for use in a logic array, the logic cell comprising:
  at least one look-up table including a plurality of LUT inputs and at least one output; and
  at least one logic gate having a plurality of logic inputs and an output coupled to one of the plurality of LUT inputs; and also comprising a multiplexer connected to an output of at least one look-up table and an inverter selectably connectable to at least one of an output of said multiplexer and an output of said look-up table.

6. A semiconductor device comprising:
  a logic array including a multiplicity of identical logic cells, each identical logic cell comprising at least one look-up table, a metal connection layer overlying the multiplicity of identical logic cells for providing a permanent customized interconnect between various inputs and outputs thereof; and
  at least one NAND gate connected to an input of said at least one look-up table,
  wherein each said logic cell comprises at least one multiplexer and said at least one look-up table provides an input to the at least one multiplexer.

7. A semiconductor device comprising:
  a logic array including a multiplicity of identical logic cells, each identical logic cell comprising at least one look-up table, a metal connection layer overlying the multiplicity of identical logic cells for providing a permanent customized interconnect between various inputs and outputs thereof;
  wherein each said logic cell comprises at least one multiplexer and said at least one look-up table provides an input to the at least one multiplexer, and wherein said at least one look-up table comprises first and second pairs of look-up tables and said at least one multiplexer comprises first and second multiplexers, each multiplexer receiving outputs from a pair of look-up tables.

8. A logic array including at least one logic cell, the logic cell comprising:
  at least one look-up table including a plurality of LUT inputs and at least one output; and
  at least one logic gate having a plurality of logic inputs and an output coupled to one of the plurality of LUT inputs, wherein said at least one logic gate is a NAND gate.

9. A logic array including at least one logic cell, the logic cell comprising:
  at least one look-up table including a plurality of LUT inputs and at least one output; and
  at least one logic gate having a plurality of logic inputs and an output coupled to one of the plurality of LUT inputs, wherein said at least one logic gate is a NAND gate, and
  wherein said at least one look-up table comprises first and second pairs of look-up tables, said logic cell also comprising first and second multiplexers, each multiplexer receiving outputs from a pair of look-up tables.

10. A semiconductor device comprising:
  a logic array including a multiplicity of identical logic cells, each identical logic cell comprising at least one look-up table, a metal connection layer overlying the multiplicity of identical logic cells for providing a permanent customized interconnect between various inputs and outputs thereof;
  wherein said logic cell includes at least one simple logic gate selectably connected to at least one logic cell output, and wherein said simple logic gate is an inverter.

11. A logic array including at least one logic cell, the logic cell having a multiplicity of inputs and at least one output and comprising:
  at least one look-up table including a plurality of LUT inputs and at least one output; and
  at least one logic gate having a plurality of logic inputs, which are at least a part of said multiplicity of inputs, and an output coupled to one of the plurality of LUT inputs, wherein
  said at least one look-up table comprises at least one pair of look-up tables, and also comprising:
    a multiplexer receiving outputs from said at least one pair of look-up tables; and
    a flip-flop for receiving an output from said multiplexer.

12. A semiconductor device comprising:
  a logic array comprising a multiplicity of identical logic cells, each identical logic cell including at least one flip-flop; and
  a metal connection layer overlying the multiplicity of identical logic cells for interconnecting various inputs and outputs thereof in a customized manner.

13. The semiconductor device according to claim 12 and also comprising a clock tree providing clock inputs to at least one of said at least one flip-flop of said multiplicity of identical logic cells.

14. The semiconductor device according to claim 12 and wherein each logic cell receives a scan signal input which determines whether the cell operates in a normal operation mode or a test operation mode, wherein in a test operation mode nearly each flip-flop receives an input from an adjacent flip-flop thereby to define a scan chain.

15. The semiconductor device according to claim 12 and wherein said logic cell also comprises a programmable look-up table.

* * * * *